US006836502B2

(12) United States Patent
Canady et al.

(10) Patent No.: US 6,836,502 B2
(45) Date of Patent: Dec. 28, 2004

(54) SPECTROSCOPY LIGHT SOURCE (75) Inventors: Larry D. Canady, Bergheim, TX (US); Christopher B. Catterson, San Antonio, TX (US); Reuben W. Edgar, Jr., San Antonio, TX (US); Ralph Henry Hill, Jr., San Antonio, TX (US); Brian Lee Robey, San Antonio, TX (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 10/347,146

(22) Filed: Jan. 17, 2003

(65) Prior Publication Data

US 2003/0181805 A1 Sep. 25, 2003

Related U.S. Application Data (60) Provisional application No. 60/350,091, filed on Jan. 17, 2002.

(51) Int. Cl.[7] .............................................. H01S 3/00
(52) U.S. Cl. ...................................................... 372/108
(58) Field of Search ........................... 372/108, 23, 29, 372/53, 75; 600/410

(56) References Cited

U.S. PATENT DOCUMENTS

| H1364 H | 10/1994 | Toeppen .................... 372/6 |
| 5,427,817 A | 6/1995 | Goodman et al. ............ 427/65 |
| 5,534,997 A | 7/1996 | Schrader ..................... 356/301 |
| 5,584,296 A | 12/1996 | Cui et al. .................... 600/479 |
| 5,879,294 A | 3/1999 | Anderson et al. ............ 600/310 |
| 5,908,294 A | 6/1999 | Schick et al. ................. 433/29 |
| 5,966,393 A | * 10/1999 | Hide et al. ..................... 372/23 |
| 5,998,925 A | 12/1999 | Shimizu et al. ............. 313/503 |
| 6,160,828 A | 12/2000 | Kozlov et al. ................ 372/39 |

FOREIGN PATENT DOCUMENTS

| EP | 0 936 682 | 8/1999 |
| WO | WO 97/50132 | 12/1997 |
| WO | WO 99/13303 | 3/1999 |

OTHER PUBLICATIONS

Soper, Steven A. et al., "Near–Infrared, Laser–Induced Flourescense Detection for DNA Sequencing Applications" *IEEE Journal of Selected Topics in Quantum Electronics*, IEEE Service Center, US, vol. 2, No. 4, Dec. 1, 1996, pp. 1129–1139.

* cited by examiner

Primary Examiner—Quyen Leung
(74) Attorney, Agent, or Firm—Faegre & Benson LLP (57) ABSTRACT

A light source for a spectroscopy unit that measures tissue includes a block for engaging tissue and a light source. The block is formed of translucent material. The light source is positioned in close proximity to the block either directly or through use of a light fiber. The light source produces light at a single wavelength or small range of wavelengths shorter than the desired range of wavelengths to be produced by the light source for the spectroscopy unit. A luminescent material is placed in the light path between light source and the tissue to produce the desired wavelength of light when pumped by the light source.

38 Claims, 7 Drawing Sheets

SPECTROSCOPY LIGHT SOURCE

This application claims the benefit of Provisional application Ser. No. 60/350,091, filed Jan. 17, 2002.

BACKGROUND OF THE INVENTION

This invention relates generally to the field of medical instrumentation and more specifically to spectroscopy instruments.

Spectroscopic applications for the medical field are proliferating rapidly and the need for a good white light source exists. Desirable characteristics of the white light source are that it should not produce too much heat and that it should be capable of being modulated.

Conventional white light sources, such as filament lamps, produce too much heat to be used in some medical applications such as tissue oximetry because of the heat they produce. Because the light source may need to be placed in close proximity to the patient, a high level of heat production is unacceptable.

For applications involving spectral analysis, a broadband light source is necessary which covers a wider spectral range than can be covered by a single LED. If several LED's are used, then there are gaps between the wavelength coverage.

A solution to this problem is to utilize optical pumping of a luminescent compound such that the combination of pump wavelength and luminescent wavelengths combine to cover the wavelength range of interest. Luminescence includes both fluorescence, which is the relatively fast output, and phosphorescence, which is the relatively slow output. Typical fluorescence lifetimes are $10^{-6}$ seconds, whereas phosphorescent lifetimes are in seconds.

A somewhat similar concept is currently being used to produce a "white LED" flashlight, such as the ones marketed by Laserlyte of Torrance, Calif. In these flashlights, a bluish LED is used to pump a luminescent dye or compound such that the resultant output appears white to the eye. However, for spectroscopic applications, such as the tissue oximeter and others, the wavelength range of interest covers other regions, where current technology does not exist. Specifically, in the near infrared region, where tissue oximetry is important, such a "quasi-white" LED does not exist. It is the purpose of this invention to describe the method and apparatus necessary to address this need. In this context, "white" means a relatively broad spectral bandwidth, and does not necessarily mean white to the eye. This could also be referred to as "quasi-white" or "broadband near infrared", if in the near infrared region of the spectrum.

U.S. Pat. No. 5,998,925 (Shimiziu et al.) claims a light emitting diode (LED) with a nitride compound semiconductor and a phosphor with a garnet fluorescent material. However, the Shimiziu et al. LED is not well suited to be placed in close proximity to a patient to ensure substantial light entry into the patient, nor is it in the correct wavelength region to be of use for particular medical applications such as a tissue.

SUMMARY OF THE INVENTION

The present invention is a light source for a spectroscopy instrument. The light source, in a first embodiment, includes a light source and a block of translucent material. A luminescent material is formed within the block to pump the wavelength of the light source up to a desired range of wavelengths when the light source pumps light into the block. A surface opposite a tissue engaging surface of the block may be mirrored to reflect escaping light back into the patient. Other surfaces, except for a light receiving surface that receives light from the light source, may be metalized to further prevent light from escaping.

In a second embodiment, the spectroscopy light source includes a light source, a block and a light fiber for carrying light from the light source to the block. The light fiber is formed with the luminescent material to produce pumped light at the block.

The light source is preferably an LED, laser or a diode laser operating at 680 nm. The luminescent material preferably produces light in the range from 600 nm to 1000 nm. The luminescent material even more preferably produces light in the range from 720 nm to 850 nm when pumped by light at 680 nm.

DETAILED DESCRIPTION OF THE PREFERRED EMBODIMENT

In this invention, there are many different light sources that can be the pump source, such as a laser, plasma discharge source and the like. The selection of a light source may be dependent on the application in which the light will be used. Preferably, the light produced in the present invention will be between 600 nm and 1000 nm. Even more preferably, the light will be between 720 nm and 850 nm.

Two parameters of interest are the speed at which modulation may be done and also efficiency. If the desired light source needs to be modulated, then the pump source and resulting light may need to be rapidly modulated, e.g. a LED pump could be easily modulated, whereas an incandescent or chemical light source cannot be easily modulated on and off. If over-all efficiency is a concern, then the pump wavelength needs to be matched to the luminescent compound absorption. There are no strict rules about this. Generally the pump wavelength should be about 100 nm below the desired wavelength band. However, sometimes much shorter wavelength pumps are more efficient. For example, ultraviolet pumping (UV at for example 370 nm) could be used for some near infrared (NIR) dyes, whereas red (670 nm) may be more efficient. Cost of the LED pump and dye combination may also be of practical importance.

Note that the pump wavelength will always be shorter than the luminescent compound output. For example, 670 nm pumping of a 700 nm to 850 nm dye, the pump wavelength is shorter (lower) than the output. Light sources with long wave infrared outputs would not be appropriate. This is due to the infrared wavelength being longer than the desired near infrared output. As a further example, a $CO_2$ laser at 10 $\mu$m would not be appropriate to pump a near infrared dye at 700 nm to 850 nm.

Presently, LED's or laser diodes are the most economical approach for the pump beam. The capability to modulate the pump is important for a number of reasons: 1) to increase the signal to noise ratio of the detected signals; 2) to allow for radiative lifetime measurements of drugs or blood components which can be used to determine drug distributions or concentrations in tissue; 3) to keep average power low while using higher peak power; 4) to make lock-in detection techniques possible so interference from room lights can be eliminated; and 5) to make photon decay measurements possible which allows for density measurements.

Figure 1:
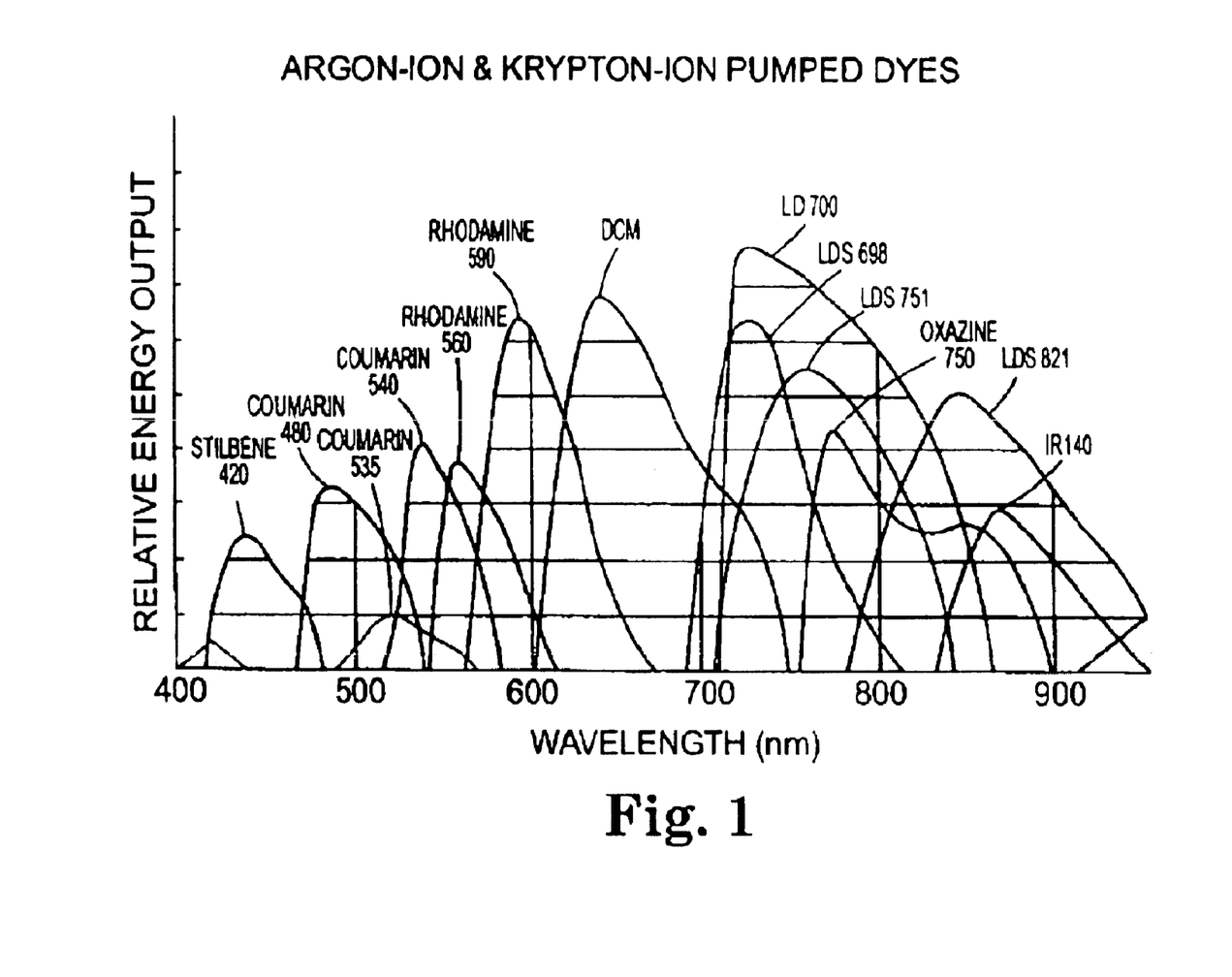
FIG. 1 is a graph of the wavelength response of selected dyes at a range of light input frequencies.

Therefore, as a specific example, consider a pump LED at 680 nm and the dye specified as Exciton LD 700. FIG. 1 shows a graph of relative energy output of many argon-ion and krypton-ion pumped dyes available from the Exciton Co. There are very many possible dyes, and this one is only suggested as one possibility. Its robustness, solubility and stability are all considerations, as well as quantum efficiency. (The best situation would be one photon out for each photon in, i.e. 100% quantum efficiency). As examples, ntirogen-pumped dyes and dyes known in the art as "infrared dyes" would also be useful in the invention.

Figure 4:
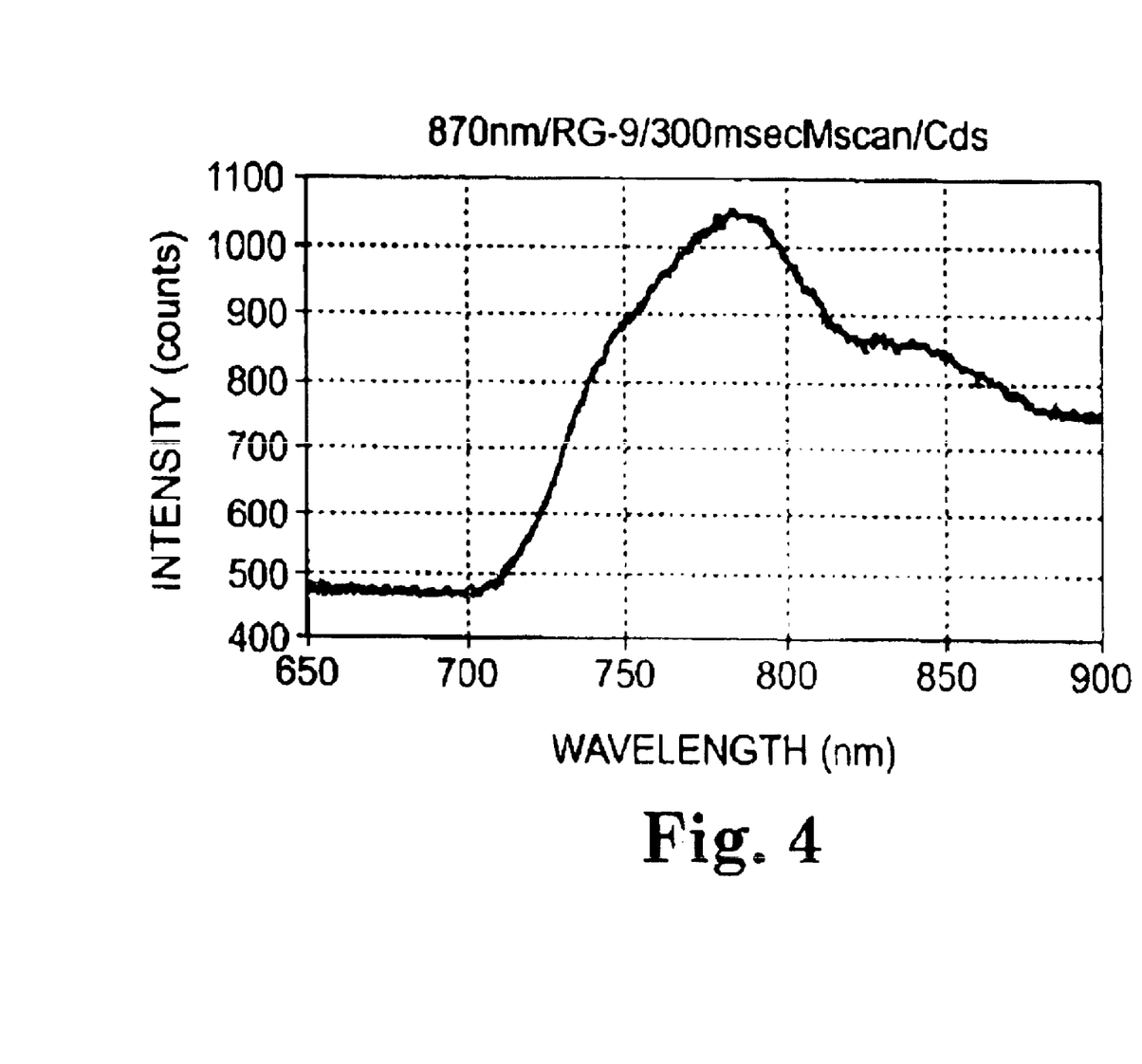
FIG. 4 is a graph of the response of Cadmium Sulfide as a function of wavelength for a pump wavelength of 670 nm.

In addition to dyes, solid compounds such as cadmium sulfide(CdS) and various compounds based on CdS may be used. Other compounds having desired luminescent characteristics may also be used such as metal salts, metal sulfates, organic and metalorganic compounds. A spectrum of the LED-induced fluorescence of CdS is shown in FIG. 4.

Figure 2:
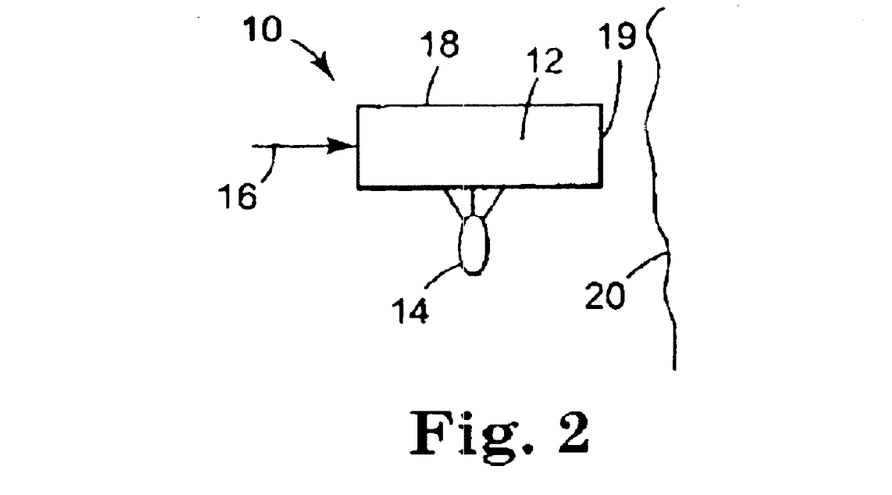
FIG. 2 is a plan view of a first light source of the present invention.

Referring now to FIG. 2, the spectroscopy light source 10 is made from block 12 and light source 14. The block 12 is made by dissolving the dye, in a 3 mM concentration, in a substantially clear material such as Polymethylmethacrylate (PMMA)or the like. The actual concentration of the dye is experimentally determined based upon the dye absorption and the method of calculation of the concentration to use is well known in the art. The solution could be left as a liquid surrounded by a container or can be dissolved into a material which would become a solid. In some circumstances, the solid is the better approach as then leakage of the dye is not an issue. While the shape of the block shown here is a rectangular shape, any shape will work that allows for a substantially flat surface 19 to face the tissue 20. The block may be shaped to fit against tissue at desired locations. Additionally, the surface 19 may be made out of a pliant material so that it can successfully be applied to many different shapes and sizes of tissue surface.

Proximate to one surface of block 12 is a light source 14. The light source is preferably an LED, a laser or a diode laser. In the present case, an LED operating at 680 nm is preferred. By using an LD700 type dye with a 680 nm pump LED, the continuous relative energy output from approximately 720 nm to 850 nm is useful for the tissue spectroscopy.

To ensure that the maximum amount of light is transferred from the block 12 to the tissue 20, surface 16 is made into a mirrored surface to reflect any light that would otherwise escape this surface back toward the tissue. Surface 18 may be made by metalizing the block from the outside. Additionally, the block could be shaped to maximize the pumping effect.

Figure 3:
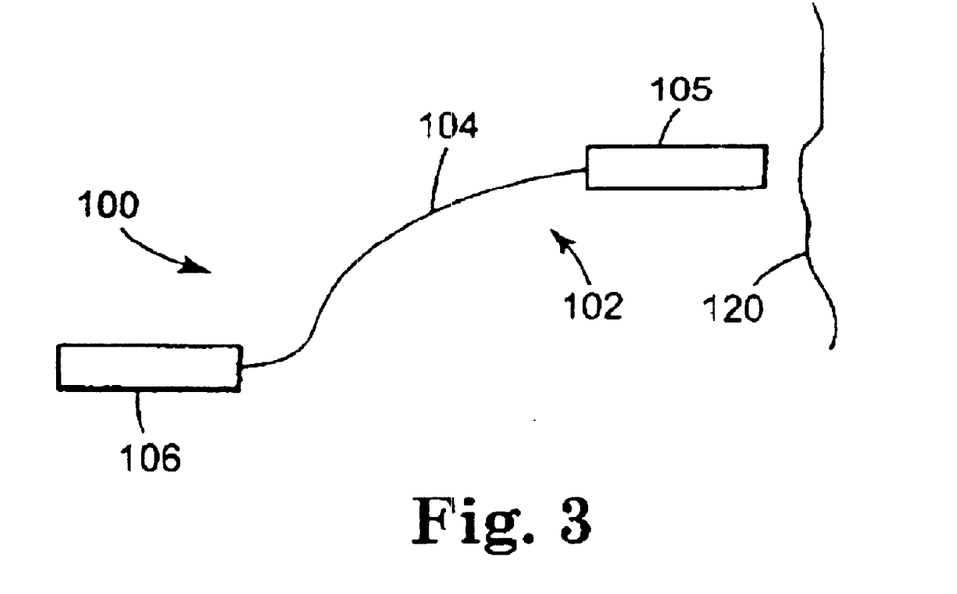
FIG. 3 is a plan view of a second light source of the present invention.

Referring now to FIG. 3, another embodiment of the invention is disclosed. Spectroscopy light source 100 is made from light guide 102 impregnated with a selected dye and light source 106. Light source 106 again is preferably an LED, a laser or a diode laser. Light guide 102 is made from a light fiber 104 and a block 105. The light fiber and the block may be constructed from PMMA. Either the light fiber 104 or the block 105 may be constructed with the selected dye, here the LD700 dye in a 3 mM concentration. Since pump power (the light produced by the combination of the Light Source and the light guide piece containing the selected dye) is the parameter of interest, a large diameter fiber would be especially useful, such as a 1 mm diameter PMMA plastic fiber, or a glass fiber bundle. The light fiber 104 can be joined to the block 105 using, for example, a number of well-known methods including UV curing optical epoxy, fusion splicing or simple butt coupling. Additionally, the block may not be necessary if the dye is dispersed along the fiber. The block 105 is then used to put the light source in contact with the tissue 120.

Figure 5A:
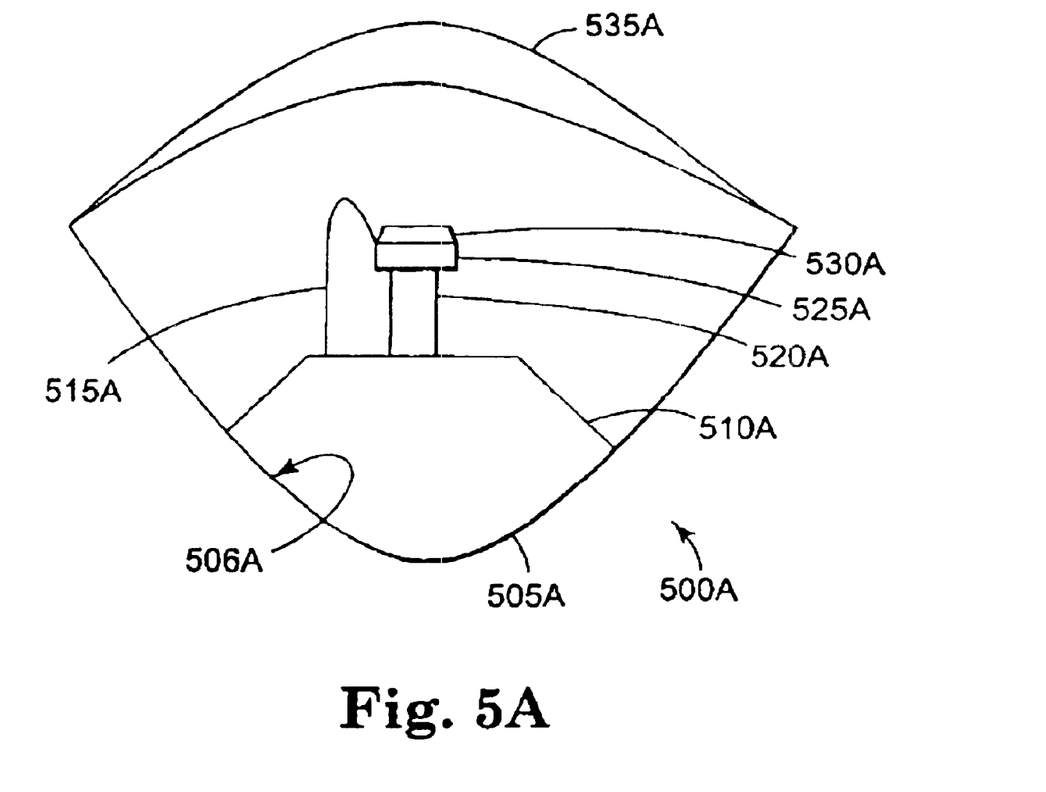
FIGS. 5A–D are plan views of LED light sources according to the present invention.

FIGS. 5A through 5D show possible structures for placing the luminescent compound adjacent to the LED structure. In FIG. 5A an LED structure 500A is shown. The package 505A along with the lens 535A encloses the active portions of the LED. The electrode connection or post 520A is supported inside the package by support 510A. Semiconductor material 525A is supported by the post 520A. An electrode connection or wire 515A provides a current path along with post 520A for the semi-conductor material 525A. Lens 535A allows light generated by energization of the semi-conductor material 525A to radiate outside the package 505A. Inside surface 506A may be formed as a parabolic reflector to increase the intensity of the light being emitted. So far, this has been a description of a standard LED.

Figure 5B:
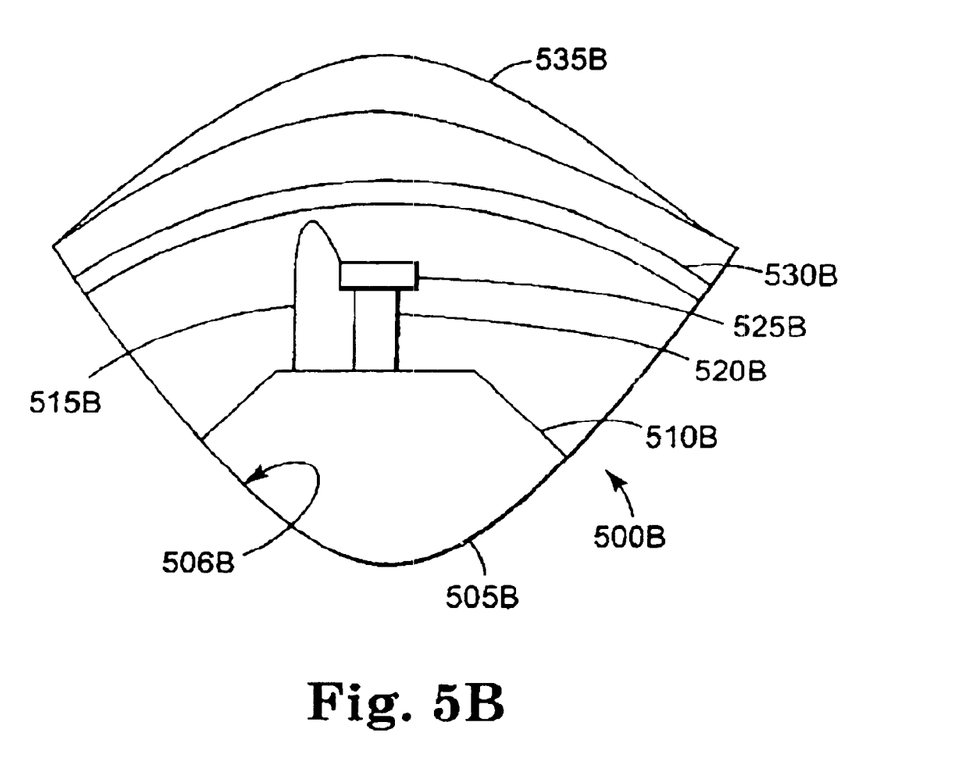
Figure 5C:
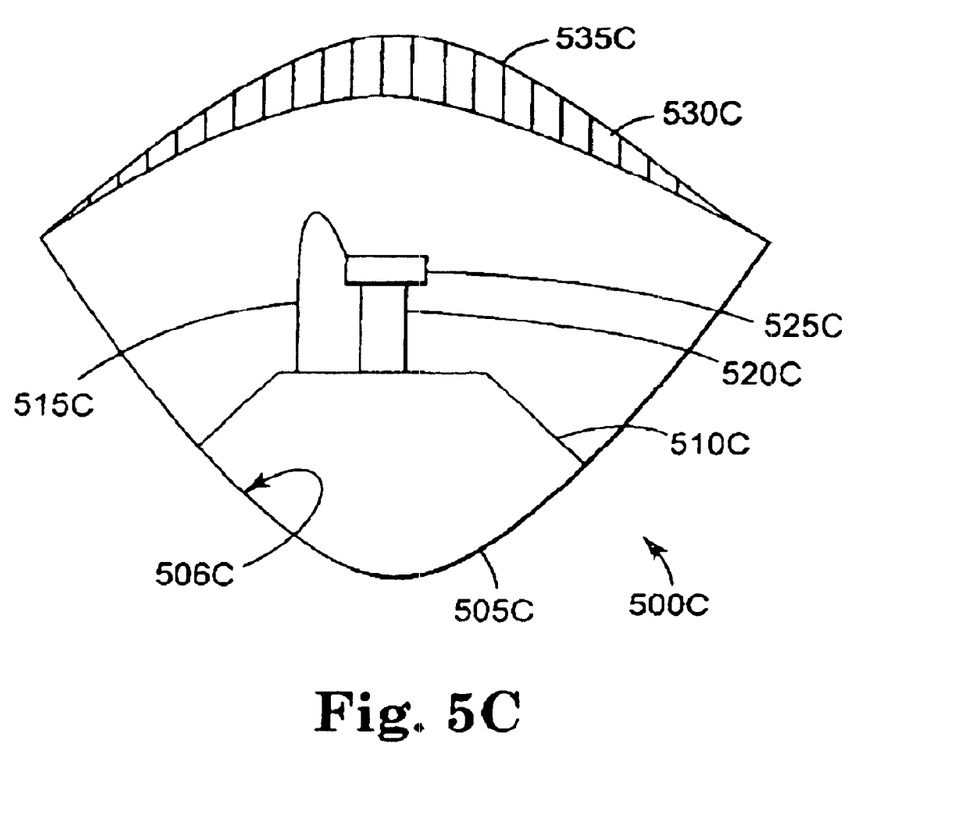
Figure 5D:
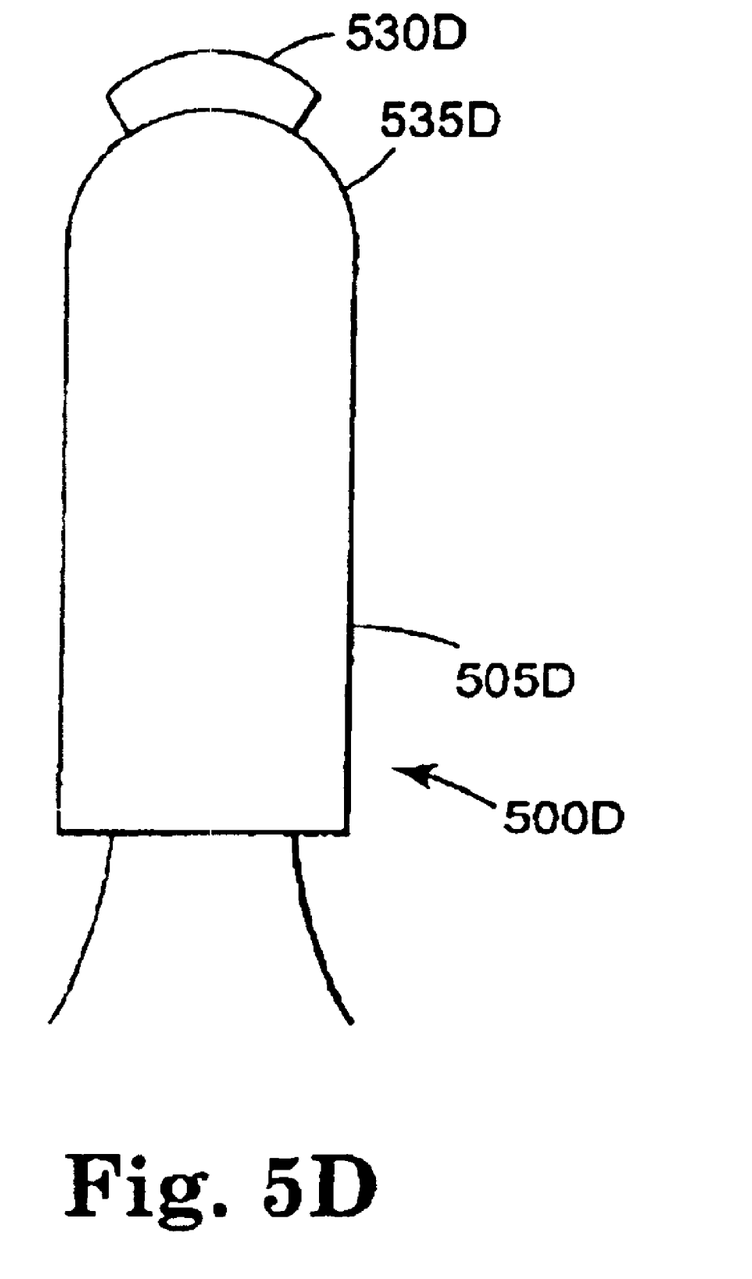

The change occurs by inclusion of the luminescent compound 530A. In FIG. 5A, the luminescent compound 630A is placed directly on a surface of the semi-conductor material 525A. In FIG. 5B, which shows essentially the same LED structure as FIG. 5A, the luminescent compound 530B is formed to be supported between the semi-conductor material 525B and the lens 535B. In FIG. 5C, the lens 535C is formed with the luminescent compound 530C being incorporated therein. Lastly, in FIG. 5D, the luminescent compound 530D is placed on the lens 535D, outside the package 505D.

We claim:

1. A spectroscopy light source for use in spectroscopy systems that measure the light absorption characteristics of a target, comprising:
   (a) alight source
   (b) a block formed of a material allowing light transmission therethrough, the block formed with a luminescent material therein, wherein the block has a target surface through which light may pass onto the target and a reflective surface being formed with a reflective surface thereon to reflect escaping light back onto the target.

2. A spectroscopy light source for use in spectroscopy systems that measure the light absorption characteristics of a target, comprising:
   (a) a light source
   (b) a light diffusing structure formed of a material allowing light transmission therethrough, the light diffusing structure having a first surface being a tissue engaging surface, and a second surface formed with a reflective surface thereon to reflect escaping light back onto toward the first surface, the light diffusing structure formed with a luminescent material therein wherein the light diffusing structure is shaped to fit against tissue.

3. The spectroscopy light source of claim 1 wherein the block is made from Polymethylmethacrylate (PMMA).

4. The spectroscopy light source of claim 1 wherein the luminescent material has a substantial wavelength response from about 600 nm to about 1000 nm.

5. The spectroscopy light source of claim 4 wherein the luminescent material has a substantial wavelength response from about 720 nm to about 850 nm.

6. The spectroscopy light source of claim 4 wherein the light source is a light emitting diode operating at 680 nm.

7. The spectroscopy light source of claim 1 where the luminescent material is selected from the group of dyes comprising: argon-ion pumped dyes, infrared dyes, nitrogen-pumped dyes and krypton-ion pumped dyes.

8. The spectroscopy light source of claim 1 wherein the luminescent material is a solid compound.

9. The spectroscopy light source of claim 8 wherein the luminescent material includes Cadmium Sulfide.

10. The spectroscopy light source of claim 8 wherein the luminescent material includes a metal salt.

11. The spectroscopy light source of claim 8 wherein the luminescent material includes a metal sulfate.

12. The spectroscopy light source of claim 1, wherein the surfaces other than the reflective surface, the target surface and a surface where the light will enter from the light source, are metalized to prevent light from escaping.

13. A spectroscopy light source for use in spectroscopy systems that measure the light absorption characteristics of a target comprising:
   (a) a light source;
   (b) a light carrying fiber formed with a luminescent material therein, the light carrying fiber being in operational connection with the light source;
   (c) a block for transmitting light into the target and connected to the light fiber.

14. The spectroscopy light source of claim 13 wherein the block is shaped to fit against the target.

15. The spectroscopy light source of claim 13 wherein the block is made from Polymethylmethacrylate (PMMA).

16. The spectroscopy light source of claim 13 wherein the luminescent material has a substantial wavelength response from about 600 nm to about 1000 nm.

17. The spectroscopy light source of claim 16 wherein the luminescent material has a substantial wavelength response from about 720 nm to about 850 nm.

18. The spectroscopy light source of claim 16 wherein the light source is a light emitting diode operating at 680 nm.

19. The spectroscopy light source of claim 13 where the luminescent material is selected from the group of dyes comprising: argon-ion pumped dyes, infrared dyes, nitrogen pumped dyes and krypton-ion pumped dyes.

20. The spectroscopy light source of claim 13 wherein the luminescent material is a solid compound.

21. The spectroscopy light source of claim 20 wherein the luminescent material includes Cadmium Sulfide.

22. The spectroscopy light source of claim 20 wherein the luminescent material includes a metal salt.

23. The spectroscopy light source of claim 20 wherein the luminescent material includes a metal sulfate.

24. The spectroscopy light source of claim 13 wherein the block is formed as a rectangular prism, one surface being a target engaging surface, the opposite surface being formed with a reflective surface thereon to reflect escaping light back onto the target.

25. The spectroscopy light source of claim 24, wherein the surfaces other than the reflective surface, the tissue engaging surface and a surface where the light will enter from the light source, are metalized to prevent light from escaping.

26. A method of producing light in a range of desired wavelengths of light, for irradiating a target to be measured by a spectroscopy system, comprising the steps of:
   (a) providing a narrowband light source having a maximum wavelength below wavelengths in the range of desired wavelengths;
   (b) placing a luminescent material in a block having a first surface being a target engaging surface, and a second surface being formed with a reflective surface thereon to reflect escaping light back onto the target between the light source and the target material the luminescent material producing light at a range of desired wavelengths when being irradiated by light radiating from the light source.

27. The method of claim 26, wherein the step of providing the narrowband light source is accomplished by providing a light emitting diode.

28. The method of claim 27, wherein the step of providing the narrowband light source is accomplished by providing a diode laser.

29. The method of claim 27 wherein the step of providing the narrowband light source is accomplished by providing a laser.

30. The method of claim 27, wherein the step of providing the luminescent material is accomplished by providing an argon-ion pumped dye.

31. The method of claim 26, wherein the step of providing the luminescent material is accomplished by providing a krypton-ion pumped dye.

32. The method of claim 26, wherein the step of providing the luminescent material is accomplished by providing a nitrogen pumped dye.

33. The method of claim 26, wherein the step of providing the luminescent material is accomplished by providing a nitrogen pumped dye.

34. The method of claim 26, wherein the step of providing the luminescent material is accomplished by providing an infrared dye.

35. The method of claim 26, wherein the step of providing the luminescent material is accomplished by providing a compound including cadmium sulfide.

36. The apparatus of claim 1 wherein the light source is operationally connected to the block through an optical fiter.

37. The apparatus of claim 2 wherein the light diffusing structure is made of a pliable material.

38. The spectroscopy light source of claim 1 wherein the block is shaped to fit against the target.

* * * * *

UNITED STATES PATENT AND TRADEMARK OFFICE
CERTIFICATE OF CORRECTION

PATENT NO. : 6,836,502 B2
DATED : December 28, 2004
INVENTOR(S) : Larry D. Canady et al.

It is certified that error appears in the above-identified patent and that said Letters Patent is hereby corrected as shown below:

Column 4,
Line 55, after "second surface" insert -- being --.

Column 6,
Line 17, after "material" insert -- , --.
Line 47, change "cadmium sulfide" to -- Cadmium Sulfide --.

Signed and Sealed this

Twenty-eighth Day of June, 2005

JON W. DUDAS
*Director of the United States Patent and Trademark Office*